United States Patent
Asari et al.

(10) Patent No.: US 7,905,700 B2
(45) Date of Patent: Mar. 15, 2011

(54) VERTICAL-TYPE HEAT PROCESSING APPARATUS AND METHOD OF CONTROLLING TRANSFER MECHANISM IN VERTICAL-TYPE HEAT PROCESSING APPARATUS

(75) Inventors: Satoshi Asari, Oshu (JP); Kiichi Takahashi, Oshu (JP); Katsuhiko Oyama, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 635 days.

(21) Appl. No.: 11/723,399

(22) Filed: Mar. 19, 2007

(65) Prior Publication Data
US 2007/0248439 A1    Oct. 25, 2007

(30) Foreign Application Priority Data
Mar. 20, 2006    (JP) .................................. 2006-076134

(51) Int. Cl.
*H01L 21/00*    (2006.01)
(52) U.S. Cl. ........................................ 414/804; 414/148
(58) Field of Classification Search .................. 414/148, 414/161, 172, 940, 937, 5, 744.5, 804; 901/34, 901/35
See application file for complete search history.

(56) References Cited

U.S. PATENT DOCUMENTS

| | | | | |
|---|---|---|---|---|
| 4,904,911 A | * | 2/1990 | Toyoda et al. | 318/568.24 |
| 4,925,312 A | * | 5/1990 | Onaga et al. | 700/261 |
| 5,110,248 A | * | 5/1992 | Asano et al. | 414/172 |
| 5,857,848 A | * | 1/1999 | Takahashi et al. | 432/253 |
| 5,963,449 A | * | 10/1999 | Ota et al. | 700/112 |
| 6,060,721 A | * | 5/2000 | Huang | 250/559.4 |
| 6,208,105 B1 | * | 3/2001 | Kato et al. | 318/568.24 |

(Continued)

FOREIGN PATENT DOCUMENTS

JP    10-107125    4/1998

(Continued)

OTHER PUBLICATIONS

Japanese Office Action issued on Jun. 2, 2009 for Japanese Patent Application No. 2006-076134 with English translation.

(Continued)

*Primary Examiner* — Charles A Fox
(74) *Attorney, Agent, or Firm* — Smith, Gambrell & Russell, LLP

(57) ABSTRACT

The present invention is a vertical-type heat processing apparatus comprising: a heat processing furnace; a holder capable of being loaded into the heat processing furnace and unloaded therefrom, with holding therein a plurality of objects to be processed at predetermined vertical intervals in a tier-like manner; a transfer mechanism including a base table capable of vertically moving and rotating, and a substrate supporter capable of horizontally moving on the base table; and a controller for controlling the transfer mechanism; wherein the transfer mechanism is adapted to transfer an object to be processed between a container containing a plurality of objects to be processed at predetermined intervals, and the holder; the substrate supporter includes a to-and-fro driving part for driving the substrate supporter in the horizontal direction, and a pitch-change driving part for changing a pitch at which the objects to be processed are supported; the controller is adapted to monitor at least one information of position, velocity and current fed back to a motor for driving the transfer mechanism; and the controller is adapted to judge, by comparing the monitored information with predetermined information corresponding to a normal drive, that the transfer mechanism is abnormally driven, and then is adapted to stop the drive of the transfer mechanism.

8 Claims, 7 Drawing Sheets

U.S. PATENT DOCUMENTS

| | | | |
|---|---|---|---|
| 6,235,121 B1 * | 5/2001 | Honma et al. | 118/730 |
| 6,377,869 B1 * | 4/2002 | Watanabe et al. | 700/245 |
| 7,275,905 B2 * | 10/2007 | Lee | 414/217 |
| 7,559,992 B2 * | 7/2009 | Suzuki et al. | 118/719 |
| 2002/0012581 A1 * | 1/2002 | Odake et al. | 414/804 |
| 2005/0175952 A1 * | 8/2005 | Toba et al. | 432/241 |
| 2007/0229015 A1 * | 10/2007 | Yoshida et al. | 318/568.21 |
| 2007/0260394 A1 * | 11/2007 | Dean | 701/207 |

FOREIGN PATENT DOCUMENTS

| | | |
|---|---|---|
| JP | 11-54593 | 2/1999 |
| JP | 2000-150612 | 5/2000 |
| JP | 2001-223254 | 8/2001 |
| JP | 2004-104011 | 4/2004 |

OTHER PUBLICATIONS

Copending Application, filed concurrently (Mar. 19, 2007), Vertical-Type Heat Processing Apparatus and Method of Controlling Transfer Mechanism in Vertical-Type Heat Processing Apparatus.

Korean Office Action issued on Aug. 24, 2010 for Korean Application No. 10-2007-0026430 with English translation.

* cited by examiner

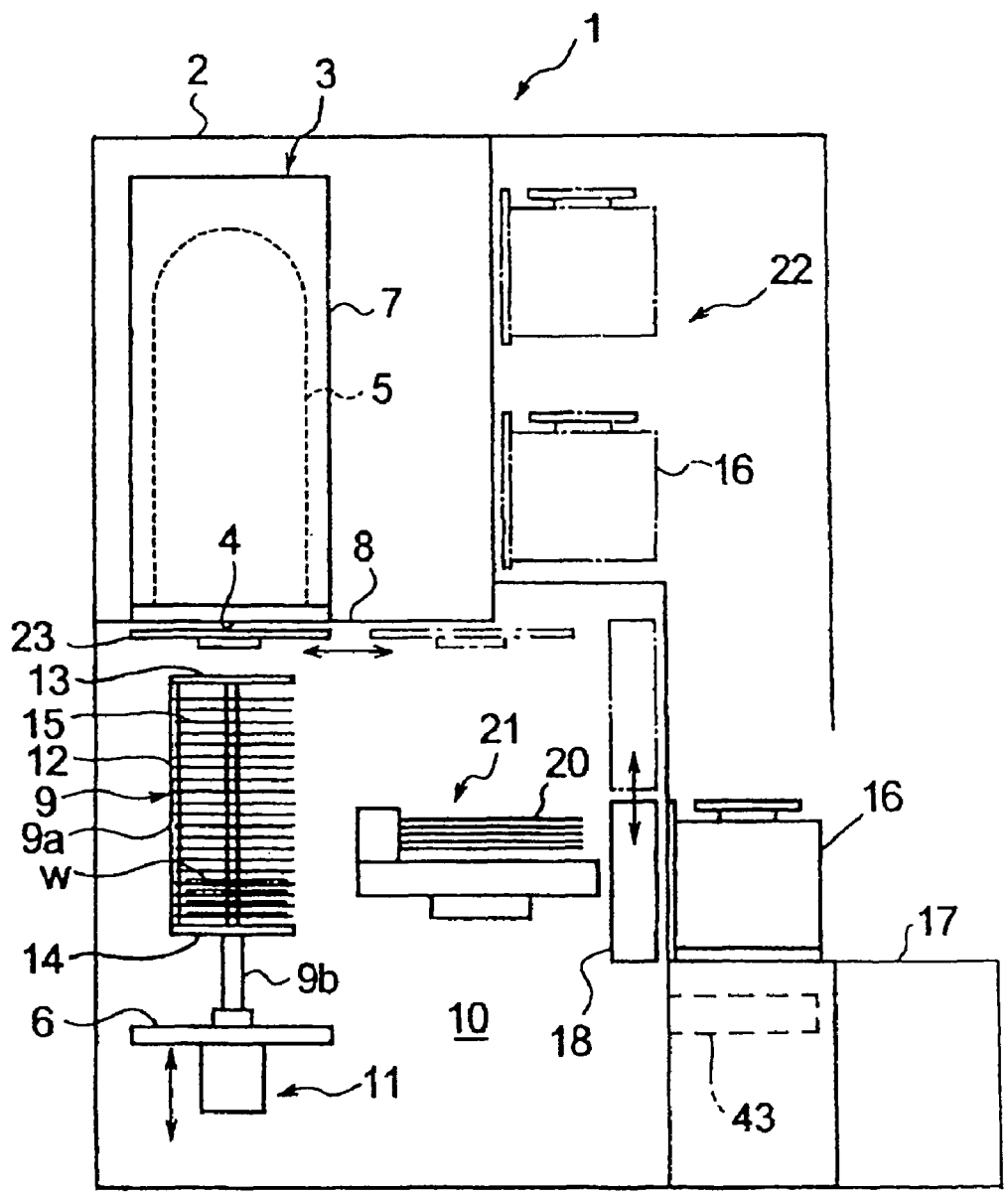
F I G . 1

VERTICAL-TYPE HEAT PROCESSING APPARATUS AND METHOD OF CONTROLLING TRANSFER MECHANISM IN VERTICAL-TYPE HEAT PROCESSING APPARATUS

FIELD OF THE INVENTION

The present invention relates to a vertical-type heat processing apparatus and a method of controlling a transfer mechanism in the vertical-type heat processing apparatus.

BACKGROUND ART

In the manufacture of semiconductor devices, various processing apparatuses (semiconductor manufacturing apparatuses) are employed for performing various processes such as oxidation processes, diffusion processes, and CVD (Chemical Vapor Deposition) processes, to objects to be processed such as semiconductor wafers (also referred to as "wafer" below). One of the known processing apparatuses is a heat processing apparatus of a batch type, such as a vertical-type heat processing apparatus, which is capable of simultaneously heat-processing a number of objects to be processed.

The vertical-type heat processing apparatus includes: a heat processing furnace; a holder (also referred to as "boat") capable of being carried into the heat processing furnace and carried out therefrom, with holding therein a number of objects to be processed at predetermined vertical intervals therebetween in a tier-like manner; and a transfer mechanism including a base table capable of vertically moving and rotating, and a substrate supporter capable of horizontally moving on the base table. The transfer mechanism transfers an object to be processed (e.g., wafer) between a container containing a plurality of objects to be processed at predetermined intervals therebetween, and the holder (see, JP2001-223254A). The transfer mechanism is an automatic transfer robot for accomplishing a predetermined, transfer operation based on a program preset in a controller.

During the transfer operation of wafers, some abnormal circumstances may occur, that is, there is a possibility that the wafer in the boat falls off a groove (one side of the wafer is disengaged from the groove of the boat), breaks, or protrudes from the boat. In such a case, the transfer mechanism driven under a normal sequence control may interfere (collide) with the abnormal wafer and knock the boat over, resulting in damage of the wafers and the boat.

SUMMARY OF THE INVENTION

In order to cope with the above situation, it has been proposed to dispose on the transfer mechanism a vibration sensor for detecting an impact or vibrations generated upon collision of the abnormal wafer with the transfer mechanism. When the vibration sensor detects vibrations exceeding a predetermined intensity, the drive of the transfer mechanism is stopped, whereby the damage of the wafers and the boat can be restrained.

However, provision of such a vibration sensor on, e.g., the substrate supporter invites a complicated structure of the mechanism and increase in costs. Further, detection precision and detection speed (response) of the vibration sensor are limited, since the sensor senses the vibrations upon generation thereof by an impact, and then converts the same into electric signals. Thus, a sufficient effect for restraining the damage of the wafers and the boat has not yet been achieved.

In view of the above problems, the present invention has been made to effectively solve the same. The object of the present invention is to provide a vertical-type heat processing apparatus with a simple structure for reducing costs, which can restrain the damage of an object to be processed and a holder as much as possible due to an improved detection speed, and a method of controlling a transfer mechanism in the vertical-type heat processing apparatus.

The present invention is a vertical-type heat processing apparatus comprising: a heat processing furnace; a holder capable of being loaded into the heat processing furnace and unloaded therefrom, with holding therein a plurality of objects to be processed at predetermined vertical intervals in a tier-like manner; a transfer-mechanism including a base table capable of vertically moving and rotating, and a substrate supporter capable of horizontally moving on the base table; and a controller for controlling the transfer mechanism; wherein the transfer mechanism is adapted to transfer an object to be processed between a container containing a plurality of objects to be processed at predetermined intervals, and the holder; the substrate supporter includes a to-and-fro driving part for driving the substrate supporter in the horizontal direction, and a pitch-change driving part for changing a pitch at which the objects to be processed are supported; the controller is adapted to monitor at least one information of position, velocity and current fed back to a motor for driving the transfer mechanism; and the controller is adapted to judge. by comparing the monitored information with predetermined information corresponding to a normal drive, that the transfer mechanism is abnormally driven, and then is adapted to stop the drive of the transfer mechanism.

For example, when there is an object to be processed which is disengaged from a groove in the substrate holder, and the substrate supporter approaches and interferes with the abnormal object to be processed (the substrate supporter is prevented from moving forward), at least one information of position, velocity and current fed back to a motor for driving the transfer mechanism changes in comparison with predetermined information corresponding to a normal drive. According to the present invention, the impact and the resultant abnormal drive of the transfer mechanism and the presence of the abnormal object to be processed in the holder can be quickly and readily detected, without the aid of a vibration sensor or the like. Namely, owing to the improved detection speed, the drive of the transfer mechanism can, be stopped immediately after the judgment of the abnormal drive. Thus, the damage of the objects to be processed and the holder can be minimized. In addition, the present invention can realize a simplified structure and decrease in costs.

Preferably, when the controller judges that the transfer mechanism is abnormally driven, the controller is adapted to notify an operator of the occurrence of the abnormal drive. In this case, a maintenance operation such as correction or collection of the abnormal object to be processed can be promptly carried out.

For example, when the controller judges that the transfer mechanism is abnormally driven while the substrate supporter of the transfer mechanism is moved forward, the controller is adapted to stop the drive of the transfer mechanism in such a manner that the controller immediately moves the substrate supporter rearward and then stops the substrate supporter. In this case, the substrate holder can be prevented from turning over, and the damages of the objects to be processed and the holder can be more effectively restrained.

In addition, the present invention is a method of controlling a transfer mechanism in a vertical-type heat processing apparatus including: a heat processing furnace; a holder capable of being loaded into the heat processing furnace and unloaded therefrom, with holding therein a plurality of objects to be processed arranged at predetermined vertical intervals therebetween in a tier-like manner; and a transfer mechanism including a base table capable of vertically moving and rotating, and a substrate supporter capable of horizontally moving on the base table; wherein the transfer mechanism is adapted to transfer an object to be processed between a container containing a plurality of objects to be processed at predetermined intervals, and the holder; the controlling method comprising the steps of: monitoring at least one information of position, velocity and current fed back to a motor for driving the transfer mechanism; and judging that the transfer mechanism is abnormally driven, by comparing the monitored information with predetermined information corresponding to a normal drive, and then stopping the drive of the transfer mechanism.

Preferably, in the stopping step, a notification of the occurrence of the abnormal drive is issued.

Further, preferably, in the stopping step, the drive of the transfer mechanism is stopped in such a manner that the substrate supporter is immediately moved rearward and then stopped.

BRIEF DESCRIPTION OF THE DRAWINGS

FIG. 1 is a longitudinal sectional view schematically showing a vertical-type heat processing apparatus in one embodiment of the present invention;

BEST MODE FOR CARRYING OUT THE INVENTION

Figure 2:
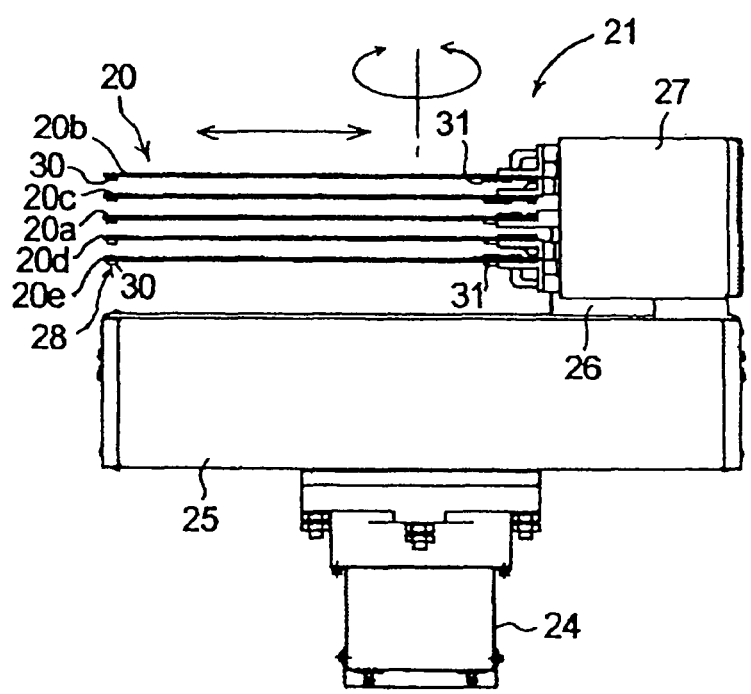
FIG. 2 is a schematic view of an example of a transfer mechanism.
Figure 3:
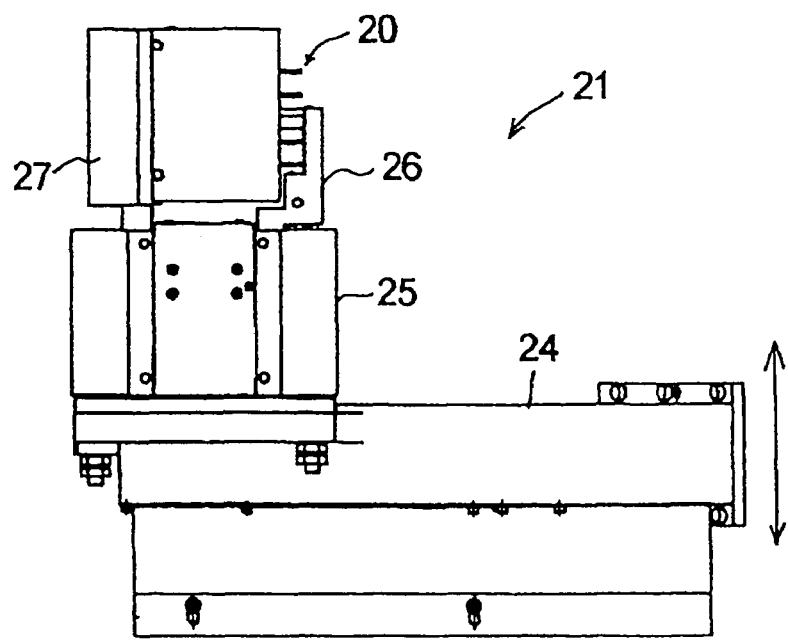
FIG. 3 is a view of the transfer mechanism shown in FIG. 2 seen from one side.

An embodiment of the present invention will be described herebelow with reference to the accompanying drawings. FIG. 1 is a longitudinal sectional view schematically showing a vertical-type heat processing apparatus in one embodiment of the present invention. FIG. 2 is a schematic view of an example of a transfer mechanism. FIG. 3 is a view of the transfer mechanism shown in FIG. 2 seen from one side.

As shown in FIG. 1, the vertical-type heat processing apparatus 1 includes a housing 2 defining a contour. In an upper area of the housing 2, there is disposed a vertical-type heat processing furnace 3 for performing a predetermined process, such as a CVD process, to an object to be-processed, such as a thin disk-shaped semiconductor wafer w, contained in the heat processing furnace 3. The heat processing furnace 3 is mainly composed of: a reaction tube 5 made of quartz which is a longitudinally elongated process vessel having a lower open end as a furnace opening 4; a lid 6 capable of vertically moving to open and/or close the furnace opening 4 of the reaction tube 5; and a heater (heating mechanism) 7 surrounding a circumference of the reaction tube 5, for heating an inside of the reaction tube 5 at a predetermined temperature between, e.g., 300° C. to 1200° C.

In the housing 2, there is horizontally disposed a base plate 8 on which the reaction tube 5 and the heater 7 as constituent elements of the heat processing furnace 3 are placed. The base plate 8 is made of SUS, for example. The base plate 8 has an opening, not shown, through which the reaction tube 5 can be inserted upward from below.

The reaction tube 5 has an outward flange on a lower end thereof. This flange is held on the base plate 8 by means of a flange holding member. Namely, the reaction tube 5 passes upward from below through the opening of the base plate 8. The reaction tube 5 can be detached downward from the base plate 8 for cleaning or the like. There are connected to the reaction tube 5 a plurality of gas inlet pipes for introducing a process gas or an inert gas for purging into the reaction tube 5, and a drain pipe provided with a vacuum pump capable of reducing a pressure in the reaction tube 5 and a pressure control valve (illustration omitted).

A working space (loading area) 10 is formed below the base plate 8 in the housing 2. In the working space 10, a boat (holder) 9 placed on the lid 6 is carried (loaded) into the heat processing furnace 3 (i.e., the reaction tube 5), the boat 9 is carried out (unloaded) from the heat processing furnace 3, and the wafers w are transferred to and from the boat 9. The working space 10 has therein a lifting mechanism 11 for moving the lid 6 upward and downward so as to load and unload the boat 9. The lid 6 can come in tight contact with an opening end of the furnace opening 4 to hermetically seal the same. A rotating mechanism, not shown, for rotating the boat 9 is disposed below the lid 6.

The illustrated boat 9 includes a body part 9a and the leg part 9b for supporting the body part 9a. The body part 9a can support a number of (e.g., about seventy-five) wafers w of a large diameter (e.g., 300 mm in diameter) in a tier-like manner by means of ring-shaped support plates 15 such that the wafers w in the horizontal conditions are arranged at predetermined vertical intervals (e.g., 11 mm pitch) therebetween. The illustrated boat 9 is made of, e.g., quartz. The leg part 9b is connected to a rotating shaft of the rotating mechanism. Between the body part 9a and the lid 6, there is disposed a lower heating mechanism, not shown, for preventing a drop in temperature caused by heat release from the furnace opening 4.

The boat 9 may be formed only of the body part 9a, without the leg part 9b. In this case, the boat 9 is placed on the lid 6 through a heat insulation tube.

The boat 9 includes: a plurality of columns 12; a top plate 13 attached on upper ends of the columns 12; a bottom plate 14 attached on lower ends of the columns 12; and the ring-shaped support plates 15 arranged in a tier-like manner, i.e., engaged with grooves formed in the columns 12 at predetermined intervals. The ring-shaped support plate 15 is made of, e.g., quartz or ceramics, and a thickness thereof is between about 2 mm and about 3 mm, and an outer diameter thereof is slightly larger than that of the wafer w.

On a front side of the housing 2 (right side in FIG. 1), there is disposed a stage (load port) 17 through which the wafer w is loaded into the housing 2 and unloaded therefrom. A container (carrier) 16 containing a plurality of, e.g., about twenty-five wafers at predetermined intervals can be placed on the stage 17. The container 16 is capable of being hermetically sealed by means of a detachable lid, not shown, provided on a front surface of the container 16.

In front of the working space 10 (right hand of FIG. 1), there is disposed a door mechanism 18 that opens the container 16 by detaching the lid therefrom so as to bring an inside of the container 16 into communication with the working space 10. There is disposed in the working space 10 a transfer mechanism 21 for transferring the wafers w between the container 16 and the boat 9. The transfer mechanism 21 has a plurality of substrate supporters 20 arranged at predetermined intervals therebetween.

In an upper front area outside the working space 10, there are disposed a storage rack 22 for storing the container 16, and a convey mechanism, not shown, for conveying the container 16 from the stage 17 to the storage rack 22 and vice versa.

In order to restrain or prevent that a heat of a high temperature in the furnace from being released therefrom to the below working space 10 through the furnace opening 4 when it is opened, a shutter mechanism 23 for covering (or blocking) the furnace opening 4 is disposed in an upper area of the working space 10.

An aligner 43 for aligning cutouts (for example, notches) formed in outer peripheries of the wafers w, which have been transferred by the transfer mechanism 21, is disposed below the stage 17.

The transfer mechanism 21 in this embodiment has a plurality of, e.g., five substrate supporters (also referred to as "forks" or "support plates") 20 (20a to 20e) for supporting a plurality of, e.g., five wafers w at predetermined vertical intervals therebetween. In this case, the middle substrate supporter 20a can independently move forward and rearward. Pitches for the substrate supporters other than the middle substrate supporter 20a, namely, the first, second, fourth, and fifth substrate supporters 20b, 20c, 20d, and 20e can be vertically changed in a stepless manner by a pitch changing mechanism, not shown, with respect to the middle substrate supporter 20a as a standard. Thus, even when a pitch between the wafers contained in the container 16 differs from a pitch between the wafers loaded in the boat 9, the plurality of wafers can be simultaneously transferred between the container 16 and the boat 9.

The transfer mechanism 21 includes a base table 25 capable of vertically moving and rotating. To be specific, the transfer mechanism 21 is provided with an elevating arm 24 capable of moving upward and downward (ascending and descending) by means of a ball screw or the like. The box-like base table 25 capable of rotating horizontally is disposed on the elevating arm 24.

On the base table 25, there are disposed a first moving member 26 and a second moving member 27 which can move along a longitudinal direction of the base table 25, i.e., in the horizontal direction. The first moving member 26 allows a forward movement of the middle substrate supporter 20a, and the second moving member 27 allows a forward movement of the four substrate supporters 20b to 20e, namely, the two upper substrate supporters 20b and 20c and the two lower substrate supporters 20d and 20e relative to the middle substrate supporter 20a. Due to this structure, it is possible to transfer a single wafer by an independent operation of the first moving member 26 (wafer-fed transfer mode), and also to collectively transfer a plurality of, e.g., five wafers at the same time by a cooperation of the first and second moving members 26 and 27 (batch transfer mode). The transfer modes can be suitably selected. A moving mechanism, not shown, for operating the first and second moving members 26 and 27 is disposed in the base table 25. The moving mechanism and the pitch changing mechanism used herein are those described in JP2001-44260A, for example.

The transfer mechanism 21 has coordinates (coordinate axes) of an up and down axis (z-axis), a rotational axis (θ-axis), and a front and rear axis (x-axis). The transfer mechanism 21 has a driving system for moving the base table 25 in the direction of the up and down axis (z-axis), a driving system for rotating the base table 25 about the rotational axis (θ-axis), a driving system for moving the substrate supporters 20 in the direction of the front and rear axis (x-axis) through the first and second moving members 26 and 27, and a driving system for changing the pitches between the substrate supporters 20. The transfer mechanism 21 also has encoders each for detecting a rotational angle of a driving part (motor, specifically, servomotor or stepping motor) of each driving system.

More concretely, the transfer mechanism 21 includes, for example, a motor 50 as a driving part of the driving system for moving the substrate supporters 20 through the first and second moving members 26 and 27 in the direction of the front and rear axis, and an encoder 51 for detecting a rotational angle of the motor 50. In addition, the vertical-type heat processing apparatus 1 includes a controller 52 that controls the transfer mechanism 21.

Figure 6:
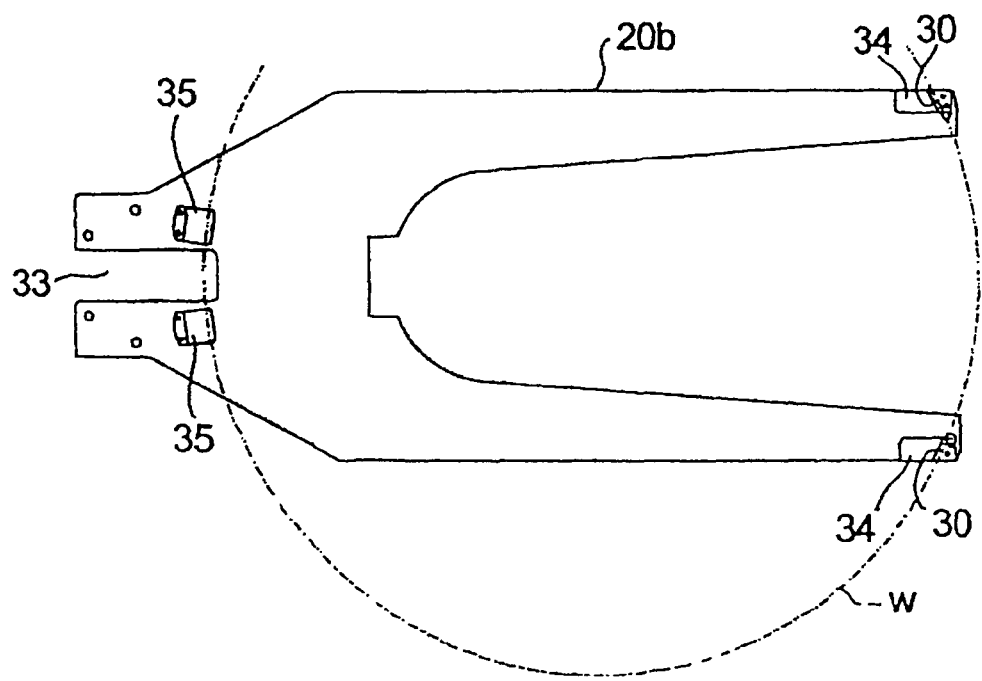
FIG. 6 is a bottom view of an example of a substrate supporter.
Figure 7:
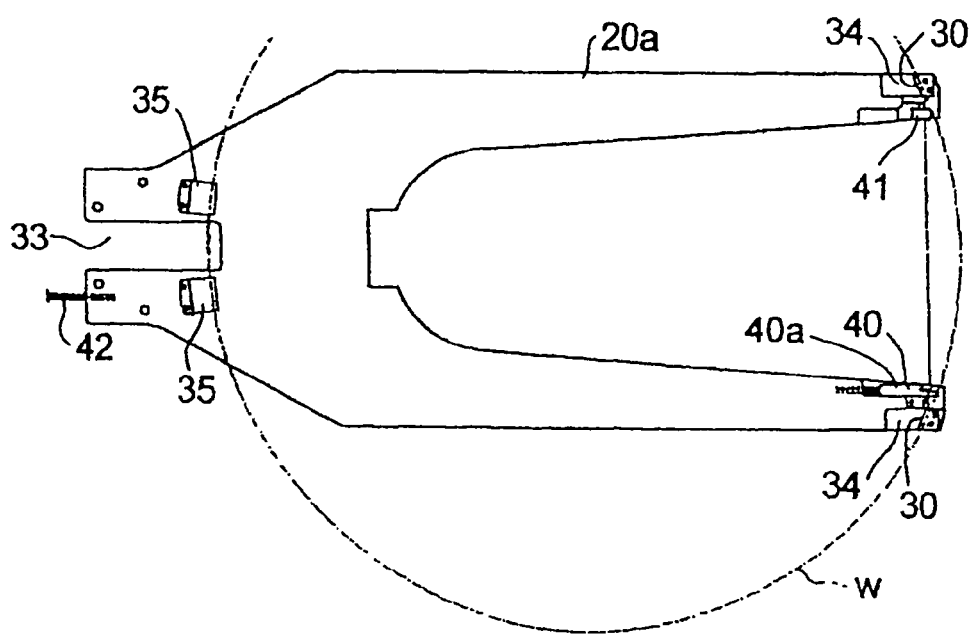
FIG. 7 is a bottom view of an alternative example of the substrate supporter.

The substrate supporter 20 is an elongated thin plate made of, e.g., alumina ceramics. Preferably, the substrate supporter 20 has an substantially U-shape in plan view with its distal end divided into two (see, FIGS. 4, 6, and 7).

Figure 8:
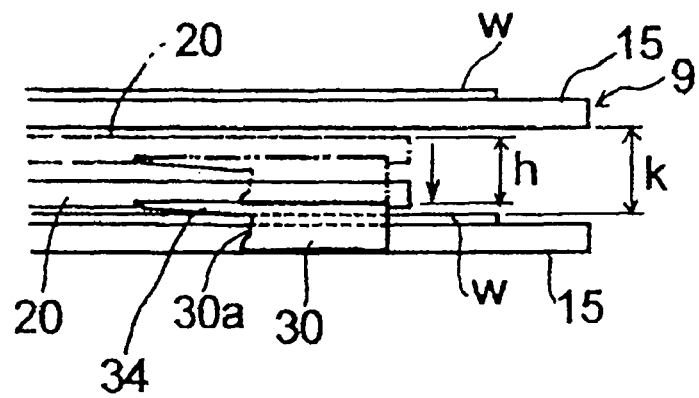
FIG. 8 is a schematic side view of a fixed locking part and a receiving part on a distal side of the substrate supporter.
Figure 9:
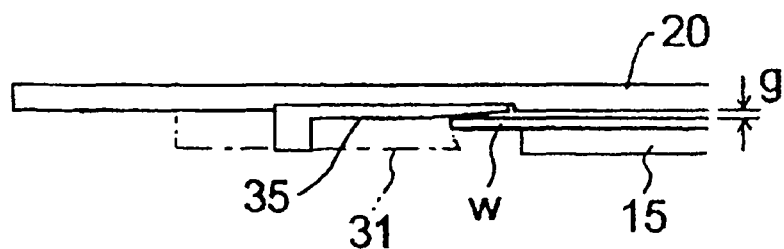
FIG. 9 is a schematic side view of a movable locking part and a receiving part on a proximal side of the substrate supporter.
Figure 10:
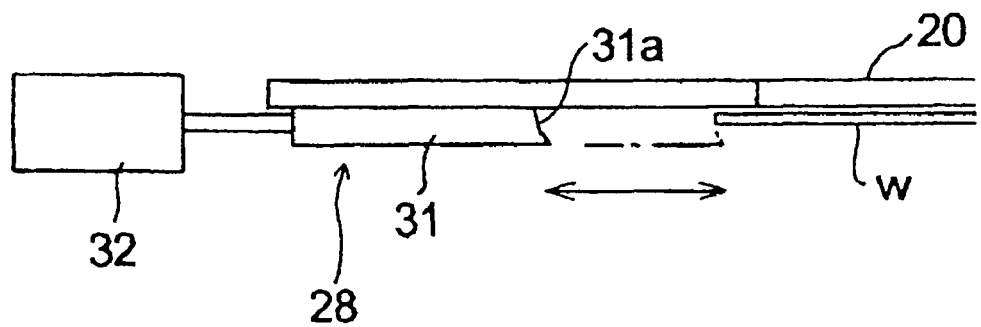
FIG. 10 is a schematic side view of the movable locking part and a driving part on the proximal side of the substrate supporter.

The transfer mechanism 21 has clamping mechanisms 28 disposed on lower surfaces, of the respective substrate supporters 20. The clamping mechanism 28 is capable of holding (in the illustrated example, clamping from above) one wafer w from the front and the rear thereof. As shown in FIGS. 8 to 10, the clamping mechanism 28 has: a fixed locking part 30 disposed on a distal (front) end side of the substrate supporter 20 for locking a front periphery of the wafer w; a movable locking part 31 disposed on a rear (proximal) end side of the substrate supporter 20 for removably locking a rear periphery of the wafer w; and a driving part such as an air cylinder 32 for driving the movable locking part 31.

By moving forward the movable locking part 31 by the air cylinder 32, the wafer w can be sandwiched between the movable locking part 31 and the fixed locking part 30. In other words, the wafer w can be clamped from the front and the rear thereof by the movable locking part 31 and the fixed locking part 30. Meanwhile, by moving rearward the movable locking part 31, the wafer can be released. Preferably, the substrate supporter 20 has on the proximal end side a cutout 33 for avoiding interference with the movable locking part 31.

It is preferable that the fixed locking part 30 and the movable locking part 31 are provided with inclined surfaces 30a and 31a, respectively, for preventing that the periphery of the wafer w is disengaged from the locking parts 30 and 31 because of the weight of the wafer w. It is also preferable that the substrate supporter 20 is provided with receiving parts 34 and 35 as spacers for receiving the front and rear peripheries of the wafer w, in such a manner that a gap g is formed between the lower surface of the substrate supporter 20 and the upper surface of the wafer w.

In the illustrated example, there are two right and left front receiving parts 34 and two right and left rear receiving parts 35. The front receiving part 34 is formed integrally with the fixed locking part 30 for downsizing the structure. The fixed locking part 30, the movable locking part 31, and the receiving parts 34 and 35 are preferably made of a heat-resistant resin such as PEEK (Poly Ether Ether Ketone).

Figure 4:
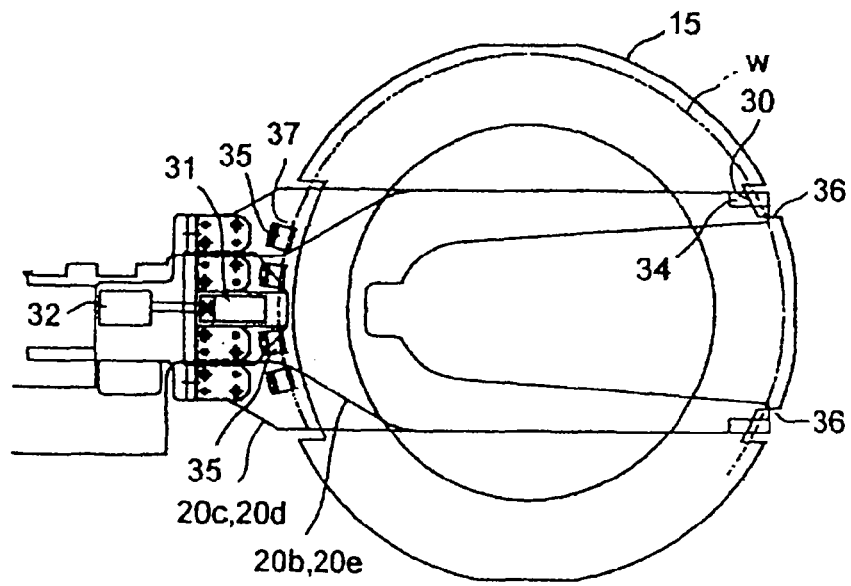
FIG. 4 is a plan view of a main part of the transfer, mechanism shown in FIG. 2.
Figure 5:
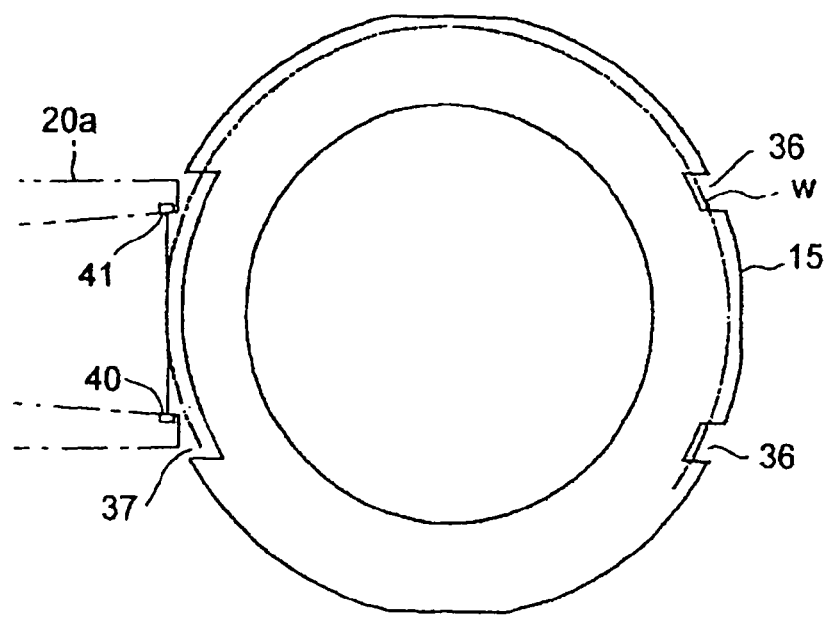
FIG. 5 is a plan view of an example of a ring-shaped support plate.

As shown in FIGS. 4 and 5, when the outer diameter of the ring-shaped support plate 15 is larger than that of the wafer w, the ring-shaped support plate 15 is preferably provided with cutouts 36 and 37 for preventing interference with the fixed locking parts 30, the movable locking part 31, and, in some cases, the receiving parts 35. When the outer diameter of the ring-shaped support plate 15 is smaller than that of the wafer w, it is not necessary to form the cutouts 36 and 37 in the ring-shaped support plate 15.

In order that one substrate supporter 20 is inserted into a space between the adjacent upper and lower ring-shaped support plates 15, a thickness dimension h between the upper surface of the substrate supporter 20 and the lower surface of the front fixed locking part 30 is preferably smaller than a space dimension k (about 7.7 mm) between the lower surface of the upper ring-shaped support plate 15 and the upper surface of the wafer w located on the lower ring-shaped support plate 15. For example, the thickness dimension h is about 5.95 mm. A mapping sensor 40 is disposed on the distal end side of the substrate supporter 20a which is capable of transferring wafers in a wafer-fed mode.

In the illustrated example, a sensor head 40a of the mapping sensor 40, which is capable of emitting and receiving an infrared light beam, is disposed on one of the distal ends of the substantially U-shaped substrate supporter 20a. On the other distal end, there is disposed a reflection mirror 41 which reflects the infrared light beam emitted from the sensor head 40a of the mapping sensor 40 to allow the infrared light beam to be incident on the sensor head 40a of the mapping sensor 40. The mapping sensor 40 is formed by connecting the sensor head 40a and a light emitting element and a light receiving element in a detecting mechanism, not shown, by an optical fiber 42.

By means of the mapping sensor 40 which vertically (direction perpendicular to the plane of FIG. 5) scans the wafers w held in the boat 9 in a tier-like manner, the transfer mechanism 21 can detect whether the wafer w is placed on each plate in the boat 9 or not, and record (map) the detected result as positional information. In addition, conditions of the wafers w which have been already processed and conditions of the wafers w which are not yet processed, can be detected (for example, whether there is a protruding wafer w or not).

During the transfer operation of the wafers, some abnormal circumstances may occur, that is, there is a possibility that the wafer w in the boat 9 falls off a groove, breaks, or protrudes from the boat. In this case, it is required to prevent the knocking over of the boat 9, which may be caused when the transfer mechanism 21 driven under a normal sequence control interferes (collides) with the abnormal wafer, so as to restrain as much as possible the damage of the wafers w and the boat 9. In order to meet this requirement, the controller 52 of the transfer mechanism 21 in this embodiment monitors all information (signals) (only one information (signal) may be also employed) of position, velocity and current fed back to the motor 50 for driving the transfer mechanism 21. Then, by comparing the monitored information with predetermined information corresponding to a normal drive, the controller 52 judges that the transfer mechanism 21 is abnormally driven (judges whether the transfer mechanism 21 is normally driven or abnormally driven). When it is judged that the transfer mechanism 21 is abnormally driven, the controller 52 stops the drive of the transfer mechanism 21 and notifies an operator of the abnormal drive (for example, gives an alarm).

In this case, it is preferable that, when the controller 52 detects (judges) that the transfer mechanism 21 is abnormally driven while the substrate supporter 20 of the transfer mechanism 21 is moved forward, the controller 52 controls the substrate supporter 20 to immediately move rearward and then stop (in other words, the substrate supporter 20 returns to a path immediately before it interfered with the wafer W).

The vertical-type heat processing apparatus 1 includes a general controller for controlling the entire apparatus, and controllers for controlling the respective mechanisms. A controller 52, which is one of such controllers, for controlling the transfer mechanism 21 has a motor driver for controlling motors (servomotors) in the respective mechanisms, with feedback of encoder values outputted from the encoders in the respective mechanisms.

Figure 11:
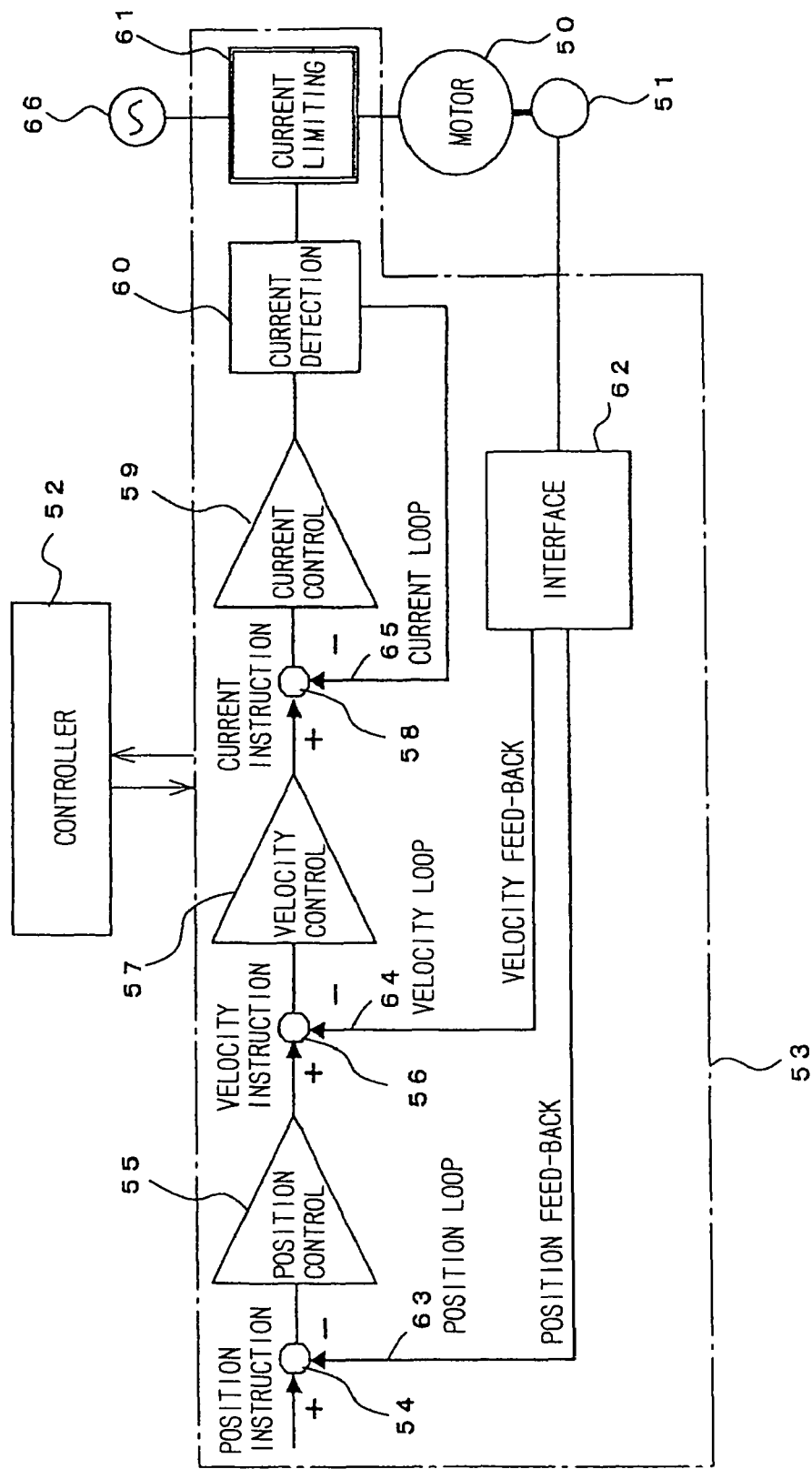
FIG. 11 is a block diagram schematically showing a control system in the transfer mechanism.

FIG. 11 is a block diagram schematically showing a control system in the transfer mechanism. Specifically, FIG. 11 shows a schematic structure of a motor driver 53 that controls the motor 50 as the driving part for moving the substrate supporter 20 forward and rearward. The motor driver 53 has: a position instructing part (comparing part) 54; an adjusting part for positional control 55; a velocity instructing part (comparing part) 56; an adjusting part for velocity control 57; an electric-current instructing part (comparing part) 58; an adjusting part for electric-current control 59; an electric-current detecting part 60; an electric-current limiting part 61; and an interface part 62 for feeding back to the motor driver 53 the signal outputted from the encoder 51 of the motor 50.

In the position instructing part (comparing part) 54, a position deviation is obtained from standard position information from the controller 52 and current position information fed back through a position loop 63 from the interface part 62, and thereby position instructing information (signal) is generated. The position instructing information is amplified as velocity information at the adjusting part for positional control 55. In the velocity instructing part (comparing part) 56, a velocity deviation is obtained from velocity information from the adjusting part for positional control 55 and current velocity information fed back through a velocity loop 64 from the interface part 62, and thereby velocity instructing information (signal) is generated. The velocity instructing information is amplified as electric-current information at the adjusting part for velocity control 57. In the electric-current instructing part (comparing part) 58, an electric-current deviation is obtained from electric-current information from the adjusting part for velocity control 57 and current electric-current information fed back through an electric-current loop 65 from the electric-current detecting part 60, and thereby electric-current instructing information (signal) is generated. The electric-current instructing information is amplified at the adjusting part for electric-current control 59, and inputted into the electric-current limiting part 61 through the electric-current detecting part 60. Then, by the electric-current limiting part 61, the electric current supplied from an electric power source 66 to the motor 55 is controlled.

For example, when there is a wafer which is disengaged from a groove in the boat 9, and the substrate supporter 20 interferes with the abnormal wafer, the substrate supporter 20 is prevented from moving forward. At that time, the motor 50 receives abnormal load, and thus consumed electric-current is increased. Electric-current information including the increase of the electric current is monitored by the controller 52 through the electric-current loop 65. Similarly, velocity information and position information are monitored by the controller 52 through the velocity loop 64 and the position loop 63. That is, the controller 52 monitors the information of position, velocity and current fed back to the motor 50. Then, by comparing the monitored information with the predetermined information corresponding to a normal drive, it is possible to judge (detect) that the transfer mechanism 21 is abnormally driven.

Herein, the combination of the three kinds of information of the position information, the velocity information and the current information is preferable for reducing detection error and improving detection precision. However, combination of two kinds of information of the velocity information and the current information is also preferable. Alternatively, only the current information may be used, whose detecting speed (responsibility) is the fastest in the three kinds of information.

Figure 12:
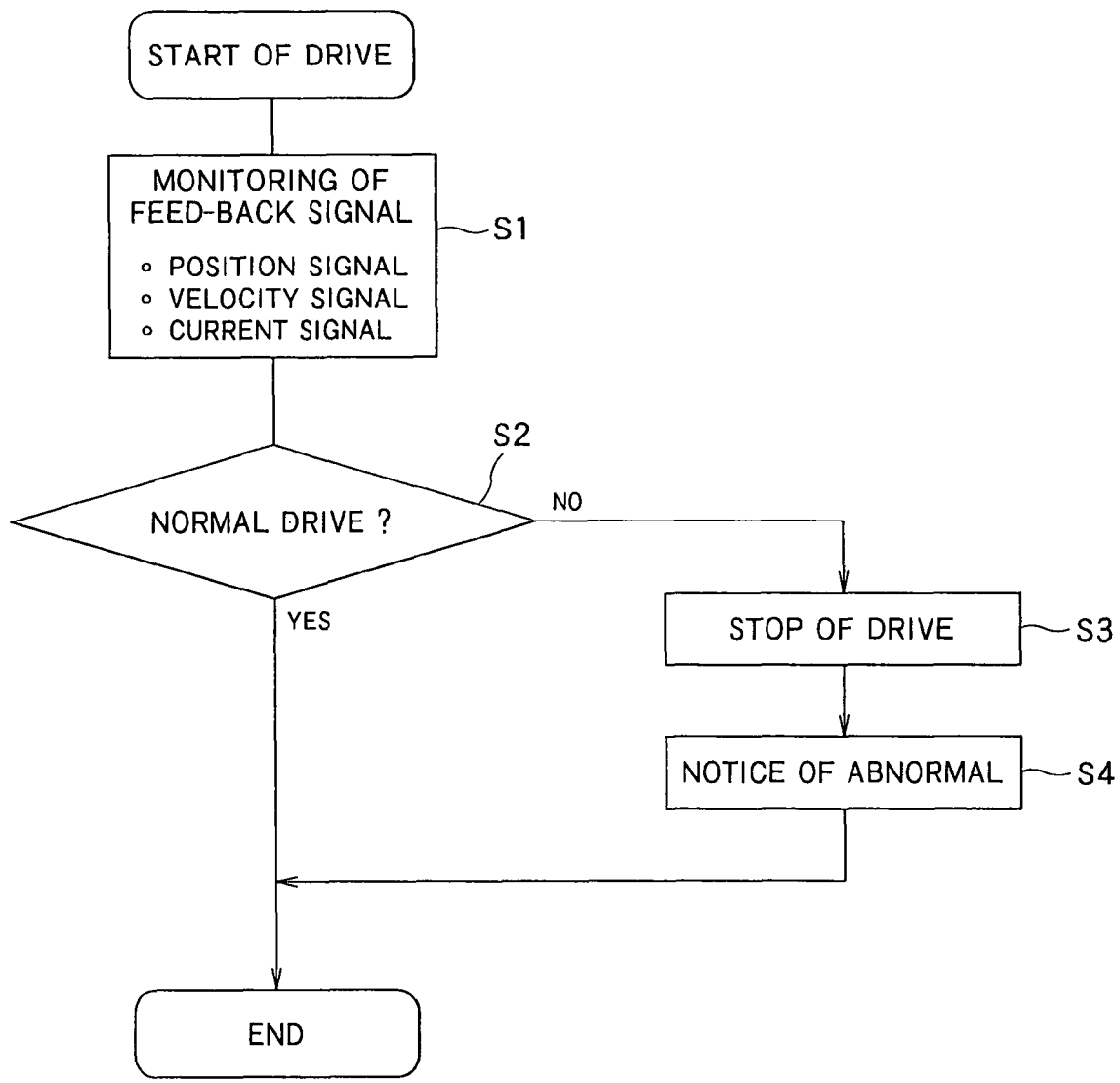
FIG. 12 is a flowchart for explaining an operation of the control system in the transfer mechanism.

FIG. 12 is a flowchart illustrating an operation of the control system of the transfer mechanism. The control method in this flowchart includes the following steps S1 to S4. In the step S1, the controller 52 monitors the information (signals) of position, velocity and current (electric current) which are feed-back signals. In the step S2, the controller 52 judges whether the transfer mechanism is normally driven (YES) or abnormally driven (NO) by comparing the monitored information with the predetermined information corresponding to a normal drive. If NO, the method proceeds to the step S3 in which the controller 52 stops the drive of the transfer mechanism 21, and the step S4 in which the controller 52 notifies an operator of the occurrence of the abnormal drive.

In order to stop the drive of the transfer mechanism 21, the supply of an electric current to the motor 50 is shut off, for example. In this case, with a view to reducing the pushing force or mitigating the impulsive force right after the interference of the transfer mechanism 21 with the wafer w, so as to avoid the falling over (knocking over) of the boat 9 and to lessen the damage as much as possible, it is preferable to shut off the supply of the electric current to the motor 50 after an electric current is supplied to the motor 50 for a reverse rotation so as to return the substrate supporter 20 to a path immediately before it interfered with the wafer W. In order to notify the operator of the abnormal drive, a warning may be displayed on a display panel, a hazard light may be turned on, or an alarm is given, to notify the operator of the occurrence of the abnormal circumference, for example, the collision of the transfer mechanism 21 with the abnormal wafer.

According to the vertical-type heat processing apparatus 1 in this embodiment, the transfer mechanism 21 includes a plurality of, e.g., five substrate supporters 20 (20a to 20e), and each of the substrate supporters 20 has the clamping mechanism 28 disposed on the lower surface thereof for clamping the wafer w from above. Thus, a plurality of, e.g., five wafers w can be simultaneously transferred to the boat 9 in which the ring-shaped support plates 15 are arranged, whereby a time required for the transfer operation can be remarkably shortened. By reducing the pitches between the ring-shaped support plates 15 from about 16 mm, which is conventional, to about 11 mm, the number of processible wafers can be increased by a factor of 1.5, i.e., from about fifty, which is conventional, to about seventy-five. Therefore, the throughput can be enhanced.

The clamping mechanism 28 includes the fixed locking parts 30 disposed on each front end of the substrate supporter 20 so as to lock the front periphery of the wafer w, the movable locking part 31 disposed on the rear end of the substrate supporter 20 so as to removably lock the rear periphery of the wafer w, and the driving part 32 for driving the movable locking part 31 forward and rearward. Thus, the wafer w can be easily clamped from above by this simple structure. In addition, the substrate supporter 20 has the receiving parts 34 and 35 for receiving the front and rear peripheries of the wafer w, respectively, in such a manner that a gap is formed between the lower surface of the substrate supporter 20 and the upper surface of the wafer w. Thus, when the wafer w is clamped from above, it is possible to prevent that the lower surface of the substrate supporter 20 and the upper surface of the wafer w rub against each other, thereby damaging the wafer w. Since the ring-shaped support plate 15 has the cutout 36 and 37 for avoiding the interference with the fixed locking parts 30 and the movable locking part 31, the clamping mechanism 28 can securely clamp the wafer w from above without any interference with the ring-shaped support plate 15.

The substrate supporter 20 transfers the wafer w by clamping the same from above with the use of the clamping mechanism 28 capable of holding the wafer w from the front and the rear thereof. When the wafer w simply placed above the substrate supporter 20 is transferred, the wafer w is likely to fall off the substrate supporter 20 when a transfer speed is relatively high. Thus, as compared with this transfer mode, the transfer speed can be increased in this embodiment, which leads to improvement in throughput.

Since conditions of the wafers w which have been already processed and conditions of the wafers w which are not yet processed can be detected by the mapping sensor 40 which vertically scans the wafers w held in the boat 9 in a tier-like manner, the conditions of the processed and unprocessed wafers w in the boat 9 can be monitored. Thus, an accident such as the damage of the wafer w can be prevented from occurring, which contributes to improvement in reliability.

In particular, in the vertical-type heat processing apparatus 1 according to the present embodiment, or the method of controlling the transfer mechanism 21 in the vertical-heat processing apparatus 1 according to the present embodiment, the information of position, velocity and current fed back to the motor 50 for driving the transfer mechanism 21 is monitored, and it is judged that the transfer mechanism 21 is abnormally driven, by comparing the monitored information with the predetermined information corresponding to a normal drive. When it is judged (detected) that the transfer mechanism 21 is abnormally driven, the drive of the transfer mechanism 21 is stopped and a notification of the occurrence of the abnormal drive is issued. Thus, a vibration sensor or the like is dispensable. In summary, the abnormal drive of the transfer mechanism 21 resulting from the interference of the abnormal wafer can be promptly and readily detected, without using a vibration sensor or the like. Since this detection method can increase the detection speed, the drive of the transfer mechanism 21 can be stopped just after the occurrence of the abnormal drive. Therefore, the damage of the wafers and the boat can be minimized. Further, a simplified structure and reduced costs can be offered.

When the abnormal drive is detected in the course of the forward movement of the substrate supporter 20 of the transfer mechanism 21, the substrate supporter 20 is immediately moved rearward and then stopped. Thus, it is possible to prevent the boat 9 from turning over, so as to more effectively restrain the damage of the wafers w and the boat 9 and the damage of the substrate supporter 20.

Although the embodiment or example of the present invention has been described in detail referring to the drawings, the present invention is not limited to the above-described embodiment or example, and the present invention can be variously modified without departing from the scope of the present invention. For example, in the above embodiment, a ring boat having the ring-shaped support plates is used as a holder. However, a general boat (ladder boat) which does not use a ring-shaped support plate may be used as a holder. In addition, in the above embodiment, the transfer mechanism is structured such that the wafer is clamped (clamped from above) below the substrate supporter. However, the substrate supporter may be turned upside down. That is, the transfer mechanism may be structured such that a wafer is supported and clamped (clamped from below) above the substrate supporter. Alternatively, the transfer mechanism may not have a clamping mechanism.

The invention claimed is:

1. A vertical-type heat processing apparatus comprising:
a heat processing furnace;
a holder, that is loaded into the heat processing furnace and unloaded therefrom, for holding therein a plurality of objects to be processed at predetermined vertical intervals in a tier-like manner;
a transfer mechanism including a base table that vertically moves and rotates, and a substrate supporter that horizontally moves on the base table;
a motor for moving the transfer mechanism;
a motor driver for controlling the motor, the motor driver including a position loop, a velocity loop, and a current loop; and
a controller for monitoring position information from the position loop, velocity information from the velocity loop, and current information from the current loop, and controlling the transfer mechanism by comparing the monitored information with predetermined information corresponding to a normal drive to judge whether the transfer mechanism is abnormally driven, the controller stopping drive of the transfer mechanism if it determines that the transfer mechanism is abnormally driven, wherein
the transfer mechanism transfers an object to be processed between a container containing a plurality of objects to be processed at predetermined intervals, and the holder, and
the substrate supporter includes a to-and-fro driving part for driving the substrate supporter in the horizontal direction, and a pitch-change driving part for changing a pitch at which the objects to be processed are supported.

2. The vertical-type heat processing apparatus according to claim 1, wherein when the controller judges that the transfer mechanism is abnormally driven, the controller notifies an operator of the occurrence of the abnormal drive.

3. The vertical-type heat processing apparatus according to claim 1, wherein when the controller judges that the transfer mechanism is abnormally driven while the substrate supporter of the transfer mechanism is moved forward, the controller stops the drive of the transfer mechanism such that the controller immediately moves the substrate supporter rearward and then stops the substrate supporter.

4. The vertical-type heat processing apparatus according to claim 1,
wherein the motor driver includes a position instructing part, an adjusting part for position control, a velocity instructing part, an adjusting part for velocity control, a current instructing part, an adjusting part for current control, a current detecting part, and a current limiting part connected to the motor, and
wherein the position loop provides position feed-back to the position instructing part, the velocity loop provides velocity feed-back to the velocity instructing part, and the current loop provides current feed-back to the current instructing part.

5. The vertical-type heat processing apparatus according to claim 4,
wherein the apparatus further comprises an encoder connected to the motor,
wherein the motor driver further comprises an interface connecting the encoder with the position instructing part and the velocity instructing part to provide each of the position loop and the velocity loop, and
wherein the current detecting part is connected to the current instructing part to provide the current feed-back loop.

6. A method of controlling a transfer mechanism in a vertical-type heat processing apparatus including a heat processing furnace; a holder, that is loaded into the heat processing furnace and unloaded therefrom, for holding therein a plurality of objects to be processed arranged at predetermined vertical intervals therebetween in a tier-like manner; a transfer mechanism including a base table that vertically moves and rotates, and a substrate supporter that moves horizontally on the base table; a motor for moving the transfer mechanism; and a motor driver having a position loop, a velocity loop, and a current loop for controlling the motor, wherein the transfer mechanism transfers an object to be processed between a container containing a plurality of objects to be processed at predetermined intervals, and the holder, said controlling method comprising the steps of:
monitoring position information, velocity information and current information from the position loop, the velocity loop and the current loop, respectively;
comparing the monitored information with predetermined information corresponding to a normal drive to judge whether the transfer mechanism is driven abnormally; and
stopping the drive of the transfer mechanism if the transfer mechanism is determined to be driven abnormally.

7. The controlling method according to claim 6, wherein in the stopping step, a notification of the occurrence of the abnormal drive is issued.

8. The controlling method according to claim 6, wherein in the stopping step, the drive of the transfer mechanism is stopped such that the substrate supporter is immediately moved rearward and then stopped.

* * * * *